United States Patent [19]

Bond, Jr.

[11] 4,063,963

[45] Dec. 20, 1977

[54] TERRESTRIAL PHOTOVOLTAIC SOLAR CELL PANEL

[76] Inventor: John W. Bond, Jr., 6621 Wakefield Drive, Apt. 306, Alexandria, Va. 22307

[21] Appl. No.: 729,745

[22] Filed: Oct. 6, 1976

[51] Int. Cl.² ............................................ H01L 31/04
[52] U.S. Cl. ............................ 136/89 P; 136/89 PC
[58] Field of Search ............. 136/89 P, 89 PC, 89 SA

[56] References Cited

U.S. PATENT DOCUMENTS

| 3,376,165 | 4/1968 | Abbot | 136/89 |
| 3,459,391 | 8/1969 | Haynos | 244/1 |

OTHER PUBLICATIONS

G. Hunrath, "Solar Power Supplies for Ground Use," Proceedings 17th Annual Power Sources Conf., May 1963, pp. 8-11.

Primary Examiner—John H. Mack
Assistant Examiner—Aaron Weisstuch
Attorney, Agent, or Firm—Nathan Edelberg

[57] ABSTRACT

Solar cells are interconnected by filaments stretched crosswise between the edges of a rectangular frame to form a gridwork, and thereby produce a lightweight inexpensive support that is not susceptible to damage from winds, snow, and ice. Additionally, the top of the cells have thin resistive wires mounted thereto for preventing snow and ice accumulation.

5 Claims, 2 Drawing Figures

TERRESTRIAL PHOTOVOLTAIC SOLAR CELL PANEL

GOVERNMENT USE

The invention described herein may be manufactured, used, and licensed by or for the Government for Governmental purposes without the payment to me of any royalties thereon.

The invention described herein relates to improved photovoltaic solar cell mounting arrangements for terrestrial applications, more particularly to an arrangement wherein solar cells are mounted to an open gridwork so as to produce a lighter and less expensive panel that is not subject to damage from winds, snow, and ice.

Prior to the instant invention, terrestrial solar cell panels were generally made from polycrystalline silicon (Si) ingots which were melted, reformed int cylindrical ingots of single crystalline Si, and then cut into circular discs 0.10 to 0.20 inch thick and usually 2 to 4 inches in diameter. The discs then had a thin conducting grid placed on the side intended to face the sun, a thin conducting film on the backside, and a thin plastic material placed thereover for protection. A plurality of these discs were then connected together to form a module which was covered on both sides with plastic (e.g., silicone rubber) for further protection and then a series of these modules were connected together in an array or panel with an aluminum or fiberglass bottom and frame. As is readily apparent, solar arrays constructed in this manner are expensive to construct, heavy and bulky. Furthermore, these solid arrays are very susceptible to damage from winds, snow, and ice.

U.S. Pat. No. 3,459,391 discloses forming a lightweight solar panel using expanded metal mesh strips as the means for interconnecting the solar cells. The panel disclosed in this patent is intended for space vehicles and satellites and is not satisfactory for terrestrial applications since, due to the relatively small open areas of the mesh strips, snow and ice would accumulate readily causing destruction of the panel due to the structural strength of the array of interconnected cells being exceeded by the weight of the snow and ice.

In the present invention these disadvantages of the prior art are overcome by utilizing an open gridwork of filaments or rods for supporting the solar cells in a manner that maximizes the amount of open area and uses a resistive wire overlay for ice and snow removal.

The exact nature of this invention as well as other objects and advantages thereof will be readily apparent from the following detailed description and the annexed drawings in which.

Figure 1:
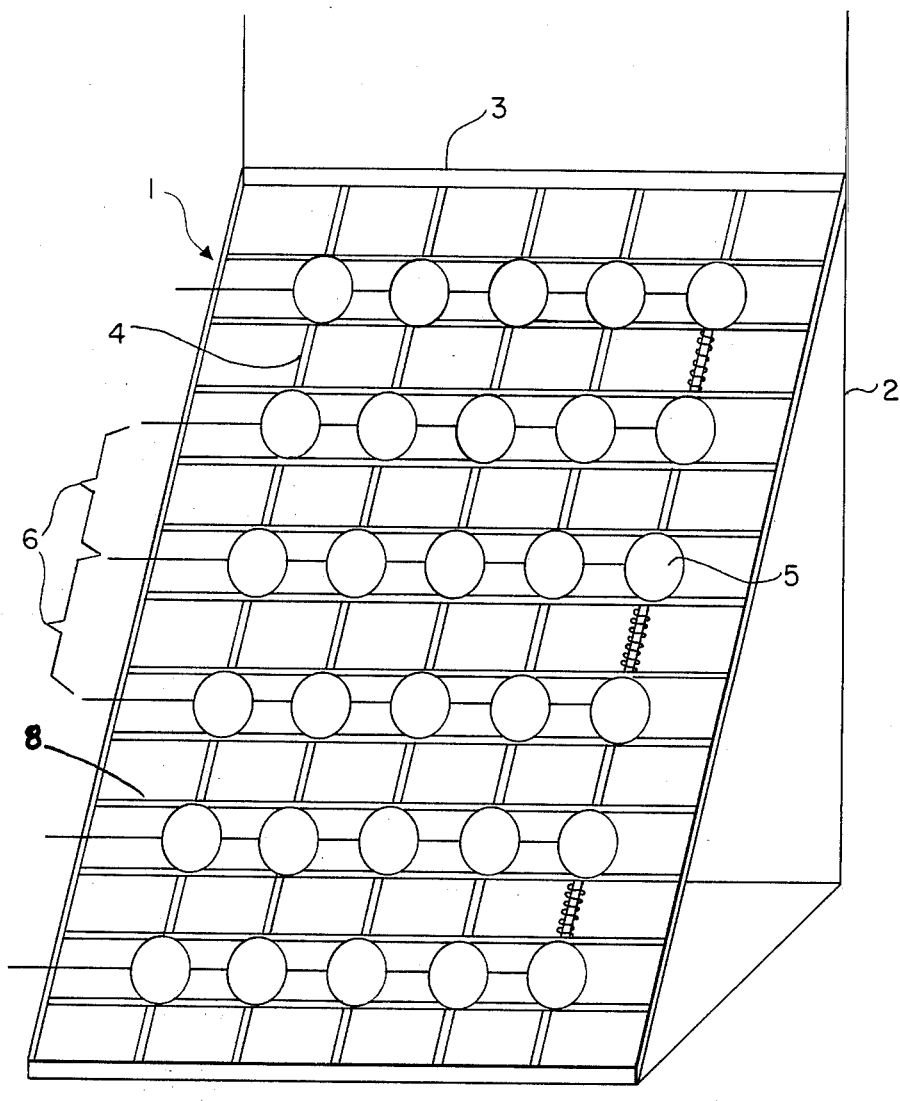
FIG. 1 is a perspective view of a preferred embodiment solar panel constructed according to the invention.
Figure 2:
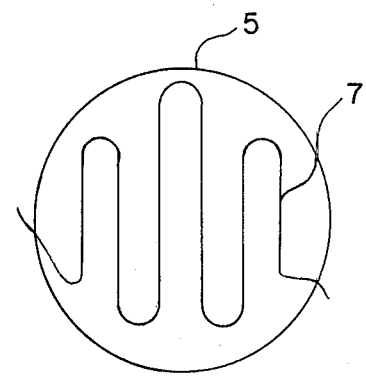
FIG. 2 is a plan view of a single solar cell with a resistive wire overlay.

Referring now to the drawings, there is shown in FIG. 1 an array or panel of photovoltaic solar cells 1 which is mounted to a support 2 which positions the panel so as to face the sun at about 45° to the horizontal. The support 2 is only schematically illustrated, as any suitable supporting leg arrangement can be used and, preferably, the arrangement selected should have means to adjust the relative angular position of the panel 1.

The panel 1 consists of a rectangular or other geometry frame 3 which can, for example, be constructed of ⅜ inch diameter hollow aluminum or plastic tubing. To the frame 3 is attached the supporting gridwork 4 having openings preferably of an order of 1–4 inches which can suitably be formed from either filaments (of nylon, for example) stretched crosswise between the sides, from thin rigid rods or a preformed grid of molded plastic. Coated photovoltaic solar cells 5 of 0.030 inch thickness and approximately 2-4 inches in diameter are then attached to the gridwork 4 at proper intervals. The cells 5 may be suitably attached by an epoxy cement, and a stronger bond can be achieved by securing the cell to a backing such that a gridwork portion is sandwiched between them. In those areas where high winds are a problem, added strength can be achieved by various gridwork arrangements. For example, a second gridwork 8 with elements thereof disposed in substantially orthogonal relation to the elements of the gridwork 4, as shown in the drawing, may be employed for added strength. Moreover, as strength can be enhanced by sandwiching the cells between two gridworks that are both attached to frame 3, the gridworks 4 and 8 each may include selectively spaced elements and the gridworks 4 and 8 may be spaced with respect to each other with selected orientation of elements thereof to permit such sandwiching of the solar cells 5. For example, the elements of the two gridworks may be in substantially orthogonal relation and the cells 5 may be edge mounted in sandwich relation to the gridworks 4 and 8, as shown in the drawing, with added strength obtained thereby. The cells are then interconnected in series by leads 6 and, in areas having cold weather conditions, thin resistive wire 7 of (for example) tungsten can be applied to the upper surface of the cells 5, such that a small amount of current will cause ice and snow to melt and drop off the array. As can be plainly seen, solar panels constructed in accordance with the invention are light in weight, aiding transportation in portable modes and reducing roof loads in fixed emplacements, while at the same time the fact that surface area is reduced to a minimum with openings throughout reduces likelihook of wind damage and in combination with resistance heating, ice and snow damage.

Although the foregoing disclosure relates to preferred embodiments of the invention, it should be understood that numerous modifications such as grid spacing and cell placement may be made without departing from the spirit and scope of the invention as set forth in the appended claims.

I claim:

1. A photovoltaic solar cell array for terrestrial applications comprising:
    an open frame;
    first and second open gridworks each extending from side to side within said frame and spaced one from the other;
    a plurality of photovoltaic solar cell elements edge mounted between said gridworks in sandwich relation;
    an electrical connection means connected to each of said solar cell elements of said plurality thereof for utilization of the photovoltaic output of said solar cell elements.

2. The photovoltaic solar cell array as defined in claim 1 wherein a resistive heating means is mounted on the top surface of said cell elements.

3. The photovoltaic solar cell array as defined in claim 2 wherein said resistive heating means is an overlay of thin resistive heating wire.

4. A photovoltaic solar cell array for terrestrial application comprising:
- an open frame;
- at least one open gridwork extending from side to side within said frame;
- a plurality of photovoltaic solar cell elements mounted on said open gridwork;
- electrical connection means connected to each of said solar cell elements of said plurality thereof for utilization of the photovoltaic output of said solar cell elements;
- and resistive heating means mounted on the top surface of said cell elements.

5. The photovoltaic solar cell array as defined in claim 4 wherein said resistive heating means is an overlay of thin resistive heating wire.

* * * * *